US009430328B2

(12) United States Patent
Conte et al.

(10) Patent No.: US 9,430,328 B2
(45) Date of Patent: Aug. 30, 2016

(54) ERROR CORRECTION IN MEMORY DEVICES BY MULTIPLE READINGS WITH DIFFERENT REFERENCES

(71) Applicants: STMICROELECTRONICS S.r.l., Agrate Brianza (IT); STMICROELECTRONICS PTE LTD, Singapore (SG)

(72) Inventors: Antonino Conte, Tremestieri Etneo (IT); Kailash Khairnar, Leixlip (IE)

(73) Assignees: STMICROELECTRONICS S.R.L., Agrate Brianza (MB) (IT); STMICROELECTRONICS PTE LTD, Singapore (SG)

( * ) Notice: Subject to any disclaimer, the term of this patent is extended or adjusted under 35 U.S.C. 154(b) by 89 days.

(21) Appl. No.: 14/597,845

(22) Filed: Jan. 15, 2015

(65) Prior Publication Data
US 2015/0212881 A1    Jul. 30, 2015

(30) Foreign Application Priority Data

Jan. 24, 2014 (IT) .............................. MI2014A0098

(51) Int. Cl.
| | | |
|---|---|---|
| *G11C 29/00* | (2006.01) | |
| *G06F 11/10* | (2006.01) | |
| *G11C 29/52* | (2006.01) | |
| *G06F 11/08* | (2006.01) | |
| *G11C 13/00* | (2006.01) | |

(52) U.S. Cl.
CPC ........... *G06F 11/1068* (2013.01); *G06F 11/08* (2013.01); *G11C 13/004* (2013.01); *G11C 29/52* (2013.01); *G11C 13/0004* (2013.01); *G11C 2013/0054* (2013.01)

(58) Field of Classification Search
CPC ....... G11C 7/22; G11C 7/24; G11C 13/0004; G11C 13/004; G11C 16/26; G06F 11/1056; G06F 11/1068
See application file for complete search history.

(56) References Cited

U.S. PATENT DOCUMENTS

| | | | |
|---|---|---|---|
| 2007/0058414 A1 | 3/2007 | Hoya | |
| 2007/0091677 A1 | 4/2007 | Lasser | |
| 2008/0320366 A1 | 12/2008 | Lin | |
| 2009/0240872 A1 | 9/2009 | Perlmutter | |
| 2009/0244997 A1 | 10/2009 | Searles et al. | |
| 2010/0220514 A1* | 9/2010 | Vigoda ..................... | G11C 8/10 365/149 |
| 2011/0085378 A1 | 4/2011 | Ho | |
| 2012/0008389 A1* | 1/2012 | Kim ..................... | G11C 11/5642 365/185.03 |
| 2012/0268994 A1 | 10/2012 | Nagashima | |
| 2014/0010021 A1* | 1/2014 | Lee ..................... | G11C 11/5642 365/185.18 |

FOREIGN PATENT DOCUMENTS

EP          0442301 A2     8/1991

* cited by examiner

*Primary Examiner* — Shelly A Chase
(74) *Attorney, Agent, or Firm* — Allen, Dyer, Doppelt, Milbrath & Gilchrist, P.A.

(57) ABSTRACT

A memory device may include memory cells. The method may include receiving a request of reading a selected data word associated with a selected code word stored with an error correction code, and reading a first code word representing a first version of the selected code word by comparing a state of each selected memory cell with a first reference. The method may include verifying the first code word, setting the selected code word according to the first code word in response to a positive verification, reading at least one second code word representing a second version of the selected code word, verifying the second code word, and setting the selected code word according to the second code word in response to a negative verification of the first code word and to a positive verification of the second code word.

15 Claims, 10 Drawing Sheets

ERROR CORRECTION IN MEMORY DEVICES BY MULTIPLE READINGS WITH DIFFERENT REFERENCES

FIELD

The present disclosure relates to the field of memory devices. More specifically, this disclosure relates to the reading of memory devices.

BACKGROUND

Memory devices are used to store information in a number of applications; for this purpose, each memory device comprises a plurality of memory cells, each one for storing one or more logic values (such as one bit). For example, non-volatile memory devices are used to store information that has to be retained even when the memory devices are not powered. Particularly, in Phase-Change Memory, or PCM, (non-volatile) memory devices each memory cell is based on a storage element made of a phase-change material, which may be reversibly switched between an amorphous phase and a crystalline phase having different electrical characteristics that represent corresponding logic values. Particularly, the phase of the storage elements is stable below a predefined temperature (such as 150° C.). The phase may be changed by heating the material over that temperature. When the storage elements are brought over a nucleation temperature (such as 200° C.) and then cooled slowly, their change-phase material becomes crystalline; conversely, when the storage elements are brought over a higher melting temperature (such as 600° C.) and then cooled rapidly, their change-phase material becomes amorphous.

The memory devices may be subject to faults during a reading of their memory cells, which faults may cause corresponding errors in the logic values that are read. For example, in PCM memory devices that are embedded in Integrated Circuits (IC), or embedded PCM (ePCM), the memory devices may be written in the factory before their shipping. In this case, the memory devices may be subject to high temperatures during their mounting on Printed Circuit Boards (PCB) in the field (for example, during a reflow of corresponding solder bumps). However, this may cause a drift of the phase of the storage elements of the memory cells. In any case, a fault rate of the PCM memory devices may significantly increase with their aging (because of retention phenomena of the phase of the storage elements).

Error Correction Codes, or ECC, are known in the art for improving a reliability of the memory devices. In this case, (redundancy) control information is added to the (actual) payload information of interest. For example, one or more control bits (also called check bits) of the control information are added to each data word (formed by one or more bits of the payload information), thereby creating a code word that is stored in the memory device. The control information is used for detecting and correcting (if possible) some errors in the reading of the memory cells, so as to tolerate the corresponding faults without impairing operation of the memory devices. The capability of correcting the errors or of simply detecting the errors (but without correcting them) depends on the amount of control information that is added to the payload information. For example, code words each one composed of a data word of 32 bits plus 7 control bits allow correcting 1 error, whereas code words each one composed of a data word of 64 bits plus 21 control bits allow correcting 3 errors.

However, any increase of the amount of control information (to increase the error correction and detection capability) accordingly reduces the capacity of the memory devices. Moreover, the complexity of a circuitry used to implement the above-mentioned ECC functionality increases with the amount of the control information. This complexity of the ECC circuitry involves a waste of area of the memory devices, and then a further reduction of their capacity. In addition, this complexity of the ECC circuitry increases an access time of the memory devices (thereby slowing down their entire operation) and a power consumption thereof.

SUMMARY

In general terms, the present disclosure is based on the idea of adding one or more further readings with different references. Particularly, an aspect provides a method for reading a memory device wherein a selected code word stored with an error correction code, in response to a negative verification of a first code word (representing a first version of the selected code word read with a first reference), is set according to at least one second code word (representing a second version of the selected code word read with a second reference).

A further aspect provides a software program for implementing the method (and a corresponding software program product).

A further aspect provides a corresponding memory device.

A further aspect provides a system comprising one or more of these memory devices.

BRIEF DESCRIPTION OF THE DRAWINGS

The approach of the present disclosure, as well as further features and the advantages thereof, will be best understood with reference to the following detailed description thereof, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes—such as value, content and representation). Particularly.

DETAILED DESCRIPTION

Figure 1:
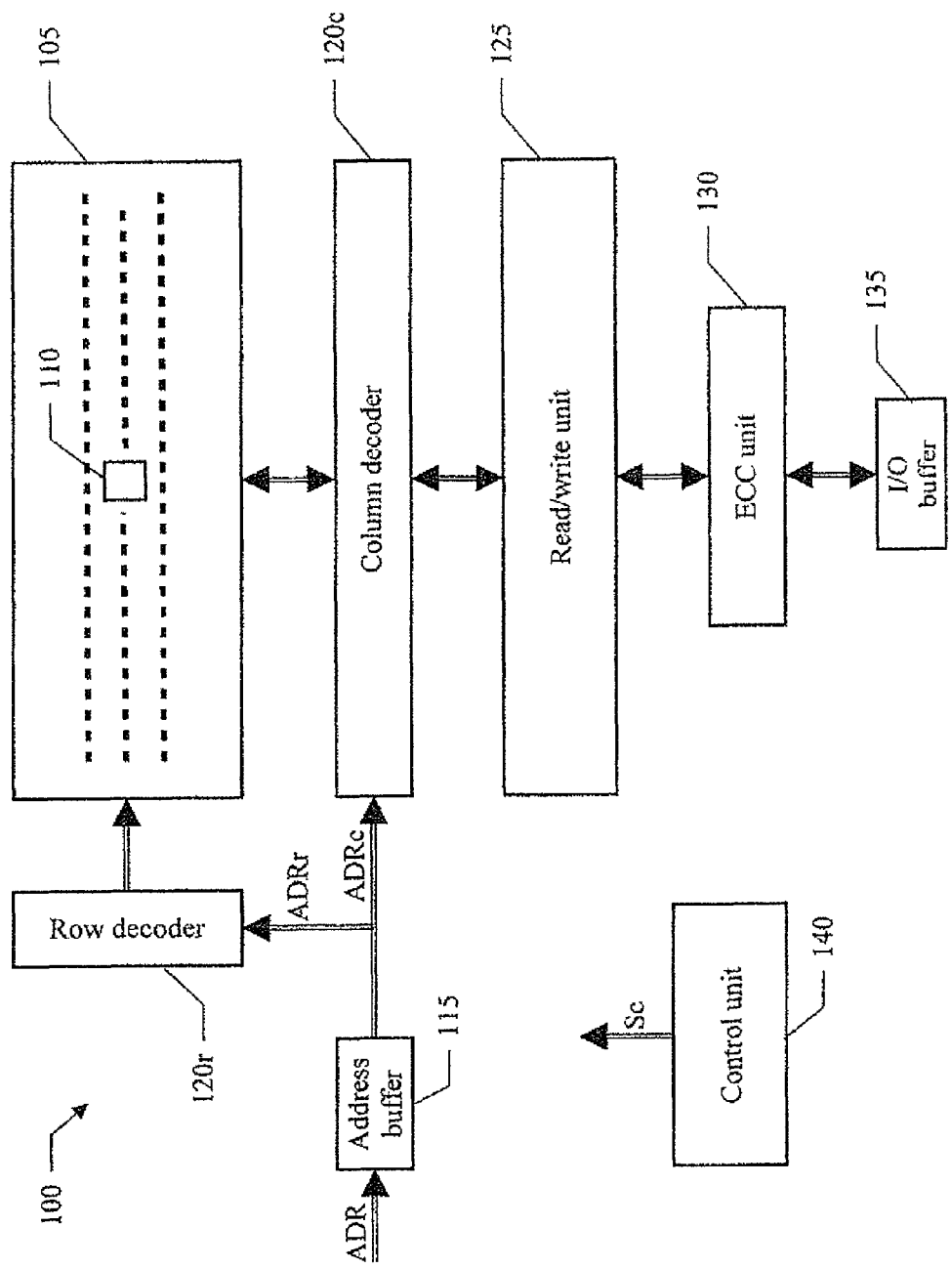
FIG. 1 is a schematic block diagram illustrating a memory device wherein the approach according to an embodiment of the present disclosure may be applied.

With reference in particular to FIG. 1, a schematic block diagram is shown of a memory device 100 wherein the approach according to an embodiment of the present disclosure may be applied; particularly, the memory device 100 is a non-volatile memory device of the PCM type (for example, an ePCM that is embedded in a system, not shown in the figure).

The memory device 100 comprises a memory matrix 105, which is formed by a plurality of memory cells 110 (only one shown in the figure) organized in rows and columns (for example, 128-512 rows and 512-1024 columns). Each memory cell 110 is based on a storage element made of a phase-change material (for example, a calcogenide such as an alloy $Ge_2Sb_2Te_5$). The storage element may be reversibly switched between a generally amorphous, disordered phase (exhibiting a relatively high resistivity) and a generally crystalline, high ordered phase (exhibiting a relatively low resistivity). The different phases of the storage element represent corresponding values (0 or 1) of one bit. Typically, the memory cell 110 is reset, or erased (value 0) when its storage element is in the amorphous phase, whereas the memory cell 110 is set, or programmed (value 1) when its storage element is in the crystalline phase.

Physically, each memory cell 110 may be written individually by applying a writing voltage higher than a phase-change voltage to its storage element (through a corresponding selection transistor). The writing voltage causes a current to flow across a resistive element (or heater) in contact with the storage element so as to control its temperature according to the value to be written. Likewise, each memory cell 110 may be read individually by applying a reading voltage lower than the phase-change voltage to its storage element (so as to avoid affecting the corresponding phase). A resulting reading current flowing across the storage element (depending on its resistivity, and then its phase) is compared with a reference current.

However, the memory device 100 typically processes (i.e., reads and writes) multiple bits simultaneously at the level of words. Particularly, the memory device 100 implements an ECC. For this purpose, the memory device 100 provides a memory space of data words storing payload information actually of interest. However, redundant control information is added to the payload information of each data word so as to obtain a corresponding code word, which is stored in a corresponding page of memory cells 110. For example, the ECC implements a Hamming code with code words each one composed by a data word of 32 bits plus 7 control bits (for a total of 39 bits), which provides a Single Error Correction and Double Error Detection (SER-DED) capability since it allows correcting any single error (relating to one bit) and detecting any double error (relating to two bits) in the code word.

An address buffer 115 receives an address ADR of a selected data word (whose code word is to be read from or written into a corresponding selected page). The address buffer 115 extracts a row address ADRr and a column address ADRc from the address ADR. The row address ADRr is provided to a row decoder 120r that selects the row of the selected page in the memory matrix 105. The column address ADRc is supplied to a column decoder 120c, which selects, within each packet of columns associated with a corresponding i-th position within all the pages, the column of the selected page.

A read/write unit 125 comprises all the components (for example, a power management unit with charge pumps, sense amplifiers, pulse generators, and the like) that are used for reading and writing the memory cells 110. For this purpose, the read/write unit 125 is coupled with the column decoder 120c and with an ECC unit 130, which in turn is coupled with an input/output (I/O) buffer 135. The input/output buffer 135 receives a data word to be written into a selected page and passes it to the ECC unit 130, which converts the data word into the corresponding code word and passes it to the read/write unit 125 that writes the memory cells 110 of the selected page accordingly. Conversely, the read/write unit 125 reads a code word from a selected page and passes it to the ECC unit 130, which generates the corresponding data word from the code word (by correcting it when necessary and possible) and passes it to the input/output buffer 135. A control unit 140 (for example, implemented by a state machine) controls operation of the whole memory device 100 (via corresponding control signals, denoted as a whole with the reference Sc).

Figure 2:
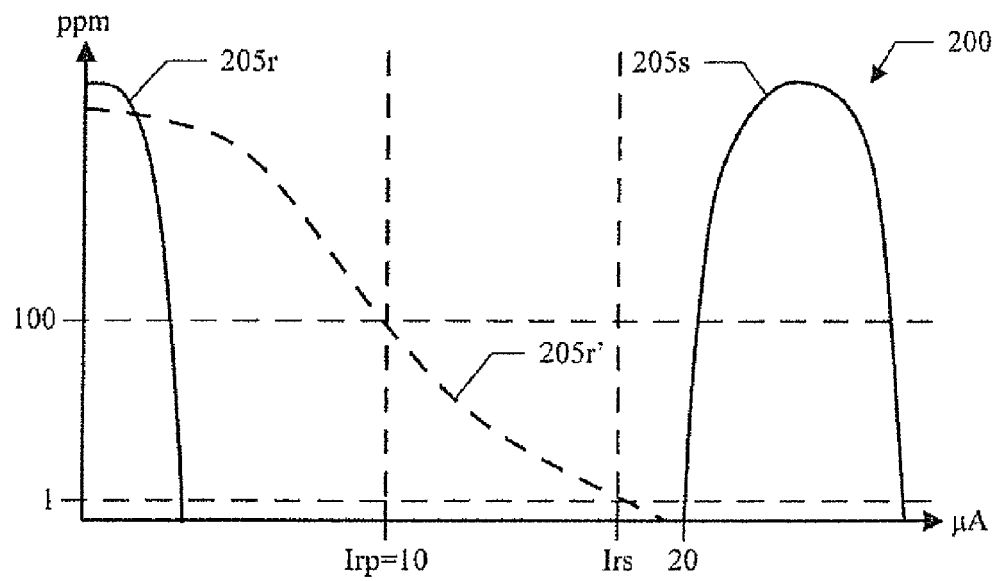
FIG. 2 is a graphical representation of exemplary statistical distributions of the memory cells of the memory device of FIG. 1.

With reference now to FIG. 2, an illustrative representation is shown of exemplary statistical distributions of the memory cells of this memory device.

For this purpose, a diagram 200 plots the number of memory cells on the ordinate axis (as parts-per-million, or ppm, i.e., $10^{-6}$, in a logarithmic scale) against their reading currents (in μA) on the abscissa axis; particularly, a probability curve 205r (in solid line) represents the probability distribution of the reading currents of the memory cells that are reset, and a probability curve 205s (in solid line) represents the probability distribution of the reading currents of the memory cells that are set. The set memory cells have higher reading currents (since their lower resistivity make them more conductive), whereas the reset memory cells have lower reading currents (since their higher resistivity make them less conductive). In each memory cell, the reading current is compared with a reference current Irp, having a value in the middle between the typical ones of the reset memory cells and of the set memory cells (for example, 8-12 μA). When the reading current is lower than the reference current Irp, the value 0 is read since the memory cell is reset; conversely, when the reading current is higher than the reference current Irp, the value 1 is read since the memory cell is set.

Ideally, the probability curve 205r and the probability curve 205s are clearly separated (for example, by 10-15 μA). However, in practice the phase of (the storage element of) the memory cells may be subject to a drift. Particularly, in ePCM memory devices that are written in the factory before their shipping, the phase of the reset memory cells may become less amorphous during the reflow of solder bumps that is used to mount a corresponding IC system on a PCB in the field; this causes an increase of the conductivity of the reset memory cells, thereby increasing their reading currents (whereas the drift of the set memory cells may be deemed negligible). As a result, the (actual) probability distribution of the reset memory cells skew thereby providing a different probability curve 205r' (in dashed line), which exhibits a tail towards higher currents. However, when the reading current of a reset memory cell exceeds the reference current Irp a wrong value of the bit stored therein (i.e., 1 instead of 0) is read (with a corresponding reading error). When the number of errors in each code word does not exceed the error correction capability of the ECC (i.e., one in the example at issue), the code word may still be corrected; however, this is not possible when the number of errors exceeds the error correction capability of the ECC (i.e., two or more in the example at issue).

In the approach according to an embodiment of the present disclosure, in addition to the above-mentioned (first) version of the code word read with the reference current Irp, hereinafter referred to as primary code word and primary reference current Irp, respectively, a second version, or more, of the same code word (referred to as secondary code word) is read with a different (secondary) reference current Irs. In this specific case (wherein the errors are mainly due to the drift of the probability distribution of the reset memory cells towards higher currents), the secondary reference current Irs is higher than the primary reference current Irp (for example, 1.5-2.1 times, preferably, 1.6-2.0 times, and still more preferably 1.7-1.9 times, such as 1.8 times, for example, equal to 18-22 µA). When the number of reading errors in the secondary code word(s) does not exceed the error correction capability of the ECC, the secondary code word(s) may now be used to provide the right code word.

This increases the error correction capability of the memory device for the same amount of control information, so as to improve its reliability, or vice-versa it allows decreasing the amount of control information for the same error correction capability of the memory device, so as to improve its capacity; in both cases, this may also allow simplifying the circuitry used to implement the ECC functionality, with a consequent reduction of waste of area of the memory device (and then increase of its capacity), and decrease of access time of the memory device (thereby fastening its entire operation) and of power consumption thereof.

Figure 3A:
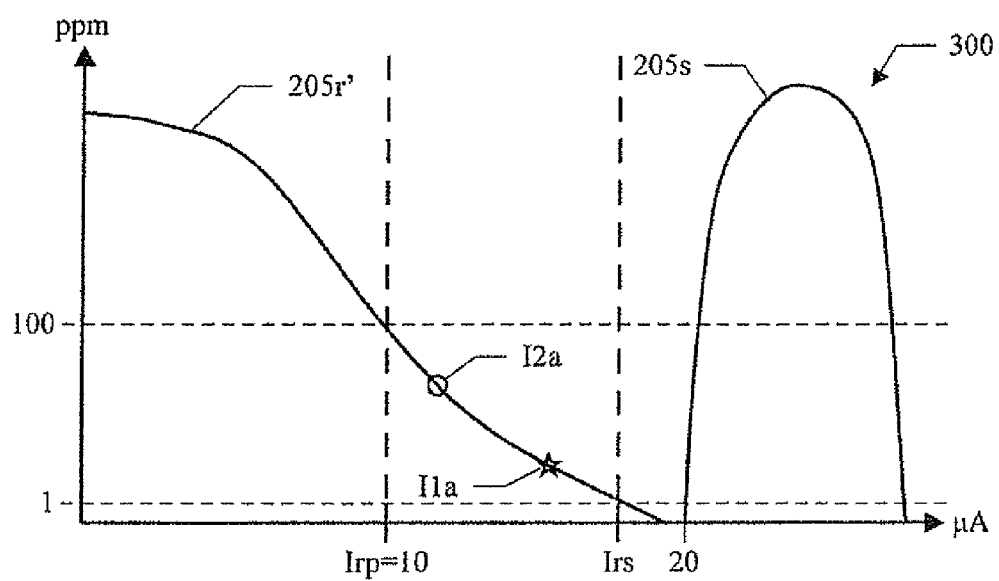
FIGS. 3A-3C are graphs of different examples of the application of the approach according to an embodiment of the present disclosure.
Figure 3B:
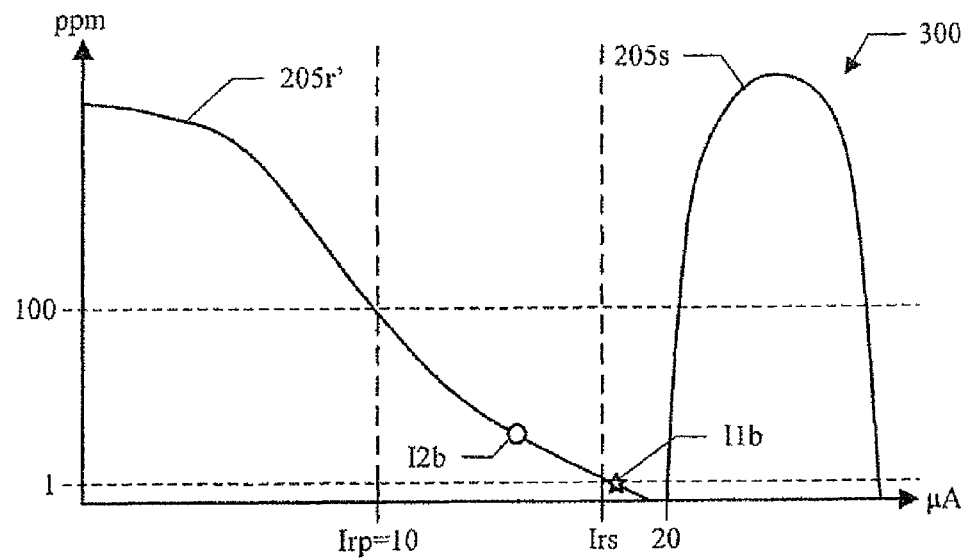
Figure 3C:
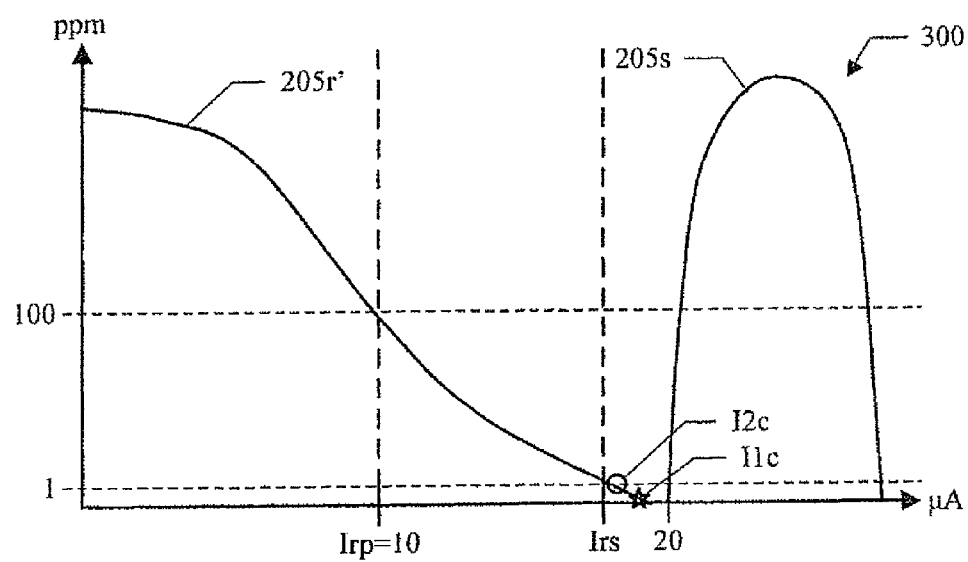

With reference now to FIGS. 3A-3C, different examples are shown of application of the approach according to an embodiment of the present disclosure.

Each figure shows a same diagram 300 with the above-mentioned distribution curves 205r' and 205s (both of them in solid lines). The secondary reference current Irs (higher than the primary reference current Irp) improves the error correction capability of the memory device with respect to errors caused by the memory cells that are reset. For example, the case is considered wherein a first memory cell and a second memory cell are both reset (i.e., storing the value 0). The first memory cell provides a reading current denoted with the reference I1 followed by the suffix of the figure (indicated by a star on the distribution curve 205r'), and the second memory cell provides a reading current denoted with the reference I2 followed by the suffix of the figure (indicated by a circle on the distribution curve 205r').

Starting from FIG. 3A, the reading with the primary reference current Irp of these memory cells generates two errors. Indeed, in the first memory cell the wrong value 1 is read, since its reading current I1a is higher than the primary reference current Irp; likewise, in the second memory cell the wrong value 1 is read, since its reading current I2a is higher than the primary reference current Irp. Therefore, should the memory cells be comprised in the same primary code word, it would not be possible to correct it.

However, the reading with the secondary reference current Irs of the same memory cells does not generate any error. Indeed, in the first memory cell the right value 0 is read, since the reading current I1a is lower than the secondary reference current Irs; likewise, in the second memory cell the right value 0 is read, since the reading current I2a is lower than the secondary reference current Irs. Therefore, assuming that the corresponding secondary code word has not other errors, the correct code word may now be obtained from it.

Moving to FIG. 3B, the reading with the primary reference current Irp of the memory cells generates two errors as above. However, the reading with the secondary reference current Irs of the same memory cells generates a single error. Indeed, in the first memory cell the wrong value 1 is read, since the reading current I1b is higher than the secondary reference current Irs. Conversely, in the second memory cell the right value 0 is read, since the reading current I2b is lower than the secondary reference current Irs. Therefore, assuming that the corresponding secondary code word has not other errors, the secondary code word may be corrected and the correct code word may now be obtained from it.

Moving to FIG. 3C, the reading with the primary reference current Irp of the memory cells generates two errors as above. The reading with the secondary reference current Irs of the same memory cells generates two errors as well. Indeed, in the first memory cell the wrong value 1 is read, since the reading current I1c is higher than the secondary reference current Irs; likewise, in the second memory cell the wrong value 1 is read, since the reading current I2c is higher than the secondary reference current Irs. Therefore, should the memory cells be comprised in the same secondary code word, it would not be possible to correct it either.

Similar considerations apply to other possible combinations of values of the reading currents (i.e., when one or more errors occur in the set memory cells, even if this event has a far lower probability). In this way, it is possible to correct most of the double errors that may occur (since the ones that may not be corrected have a very low probability, for example, lower than 10 ppm). Therefore, this provides a quasi-2 error correction capability (with a simple Hamming code of 32+7 bits).

Figure 4A:
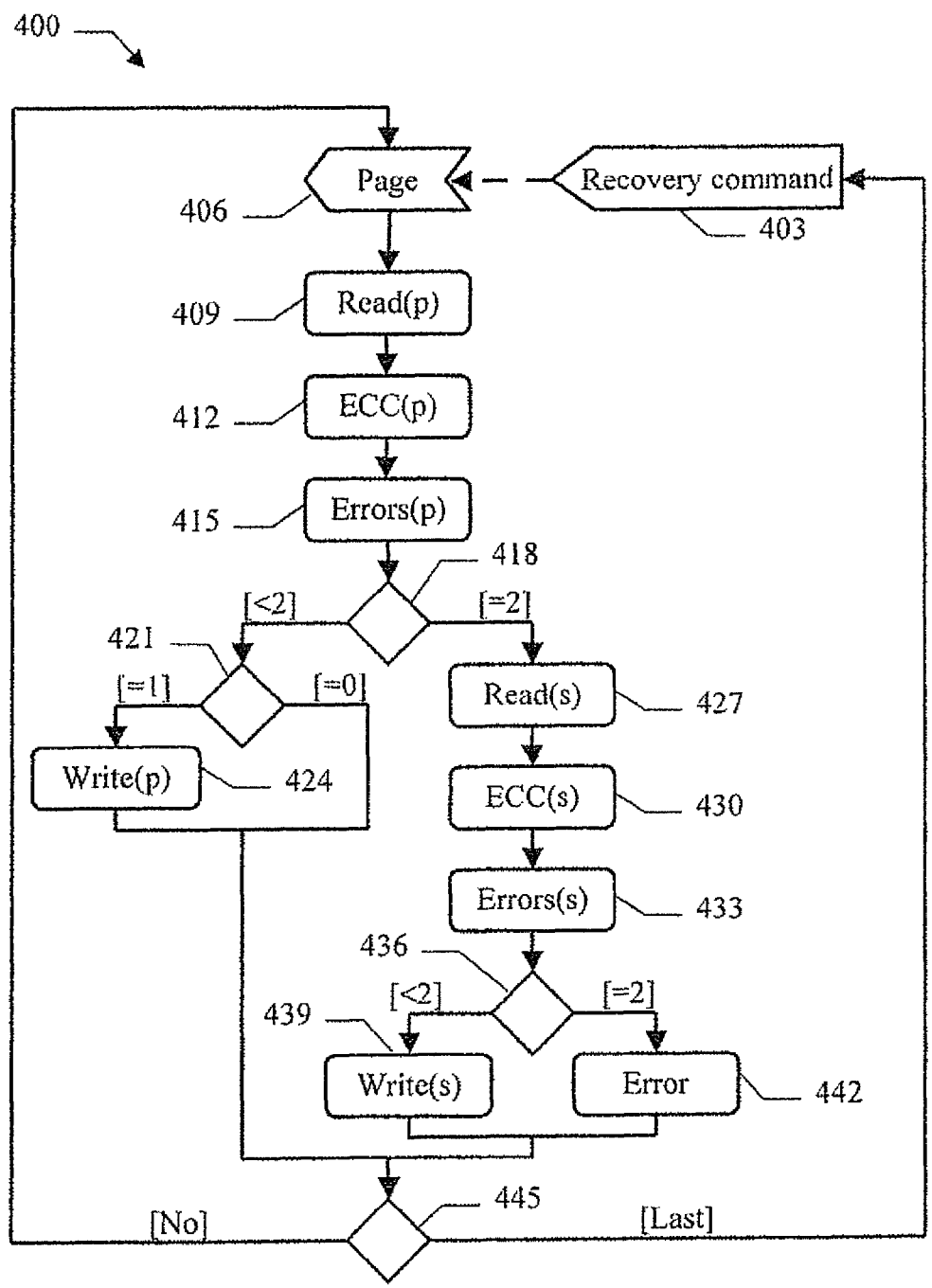
FIGS. 4A and 4B are flowcharts illustrating the flow of activities relating to an implementation of the approach according to an embodiment of the present disclosure.
Figure 4B:
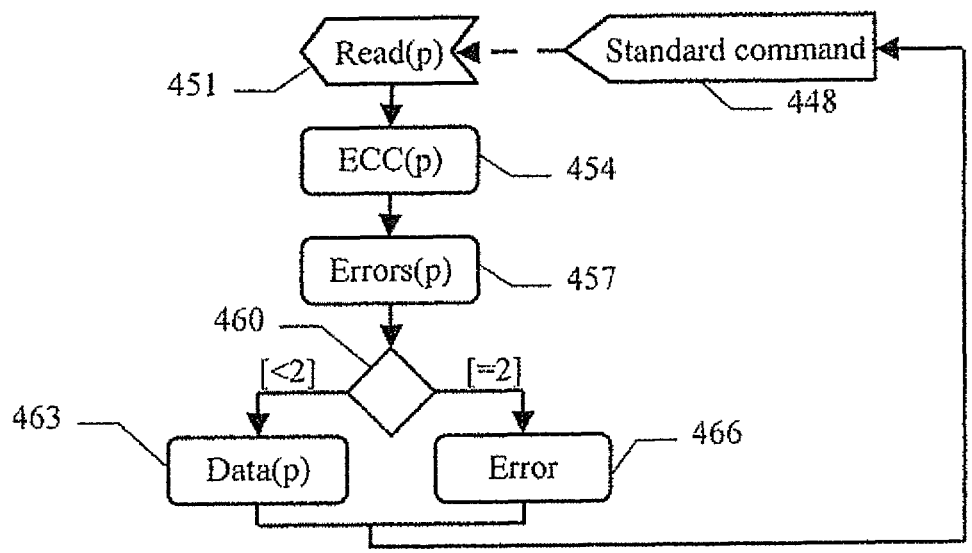

With reference now to FIG. 4, an activity diagram is shown describing the flow of activities relating to an implementation of the approach according to an embodiment of the present disclosure.

The diagram represents an exemplary process that may be used to operate the memory device with a method 400. For example, the process may be implemented by a firmware of the control unit of the memory device; in this respect, each block may represent one or more executable instructions for implementing the specified logical function by the control unit. Particularly, the memory device supports a standard reading command that is submitted for reading a selected data word as usual during a normal operation of the memory device; however, in the approach according to an embodiment of the present disclosure, the memory device further supports a recovery reading command, which is used to recover the content of the memory device after the IC system (wherein the memory device is embedded) has been mounted on the corresponding PCB (and then after the corresponding reflow).

The process is in a waiting condition at block 403 for any recovery reading command. As soon as a recovery reading command is submitted, a loop is entered at block 406 for verifying the whole memory device; for this purpose, a page of the memory device is selected (starting from the first one). The (currently) selected page is read with the primary reference current at block 409 so as to provide the corresponding primary code word. The primary code word is then processed at block 412 according to the error correction code. A result of this processing is verified at block 415 (i.e., whether the primary code word is correct, it had a single error that has been detected and corrected, or it has a double error that has only been detected). The flow of activity branches at block 418 according to the number of errors that have been detected (and possibly corrected) in the primary code word. Particularly, if less than two errors have been detected in the primary code word, the flow of activity further branches at block 421 according to the number of errors that have been corrected in the primary code word. Particularly, if a single error has been corrected in the primary code word, the (corrected) primary code word is written into the selected page at block 424, so as to restore its correct content.

Referring back to the block 418, if a double error has been detected but not corrected in the primary code word, the selected page is read with the secondary reference current at block 427 so as to provide the corresponding secondary code word. The secondary code word is then processed at block 430 according to the error correction code. A result of this processing is verified at block 433 (i.e., whether the secondary code word is correct, it had a single error that has been detected and corrected, or it has a double error that has only been detected). The flow of activity branches at block 436 according to the number of errors that have been detected (and possibly corrected) in the secondary code word. Particularly, if less than two errors have been detected in the secondary code word, the (possibly corrected) secondary code word is written into the selected page at block 439, so as to restore its correct content. Conversely, if a double error has been detected but not corrected in the secondary code word as well, an error condition is entered at block 442 (since the selected page may not be corrected).

In any case, the process descends into block 445 from the block 424 (after writing the corrected primary code word), from the block 412 (directly when no error has been detected in the primary code word), from the block 439 (after writing the possibly corrected secondary code word) or from the block 442 (when the error condition has been entered). At this point, a test is made to verify whether a last page of the memory device has been processed. If not, the process returns to the block 406 to repeat the same operations on a next page. Conversely (once all the pages have been processed), the loop is exit by returning to the block 403.

In a completely independent way, the process is in a waiting condition at block 448 for any standard reading command. As soon as a standard reading command is submitted, a selected page (identified by its address specified in the standard reading command) is read with the primary reference current at block 451 so as to provide the corresponding primary code word. The primary code word is then processed at block 454 according to the error correction code. A result of this processing is verified at block 457 (i.e., whether the primary code word is correct, it had a single error that has been detected and corrected, or it has a double error that has only been detected). The flow of activity branches at block 460 according to the number of errors that have been detected (and possibly corrected) in the primary code word. Particularly, if less than two errors have been detected, at block 463 the primary data word is extracted from the primary code word and it is returned as the requested data word. Conversely, if two errors have been detected but not corrected, no valid data word is provided and an error condition is entered at block 466. In both cases, the process then returns to the block 448.

The additional writing of the primary/secondary code word into the corresponding page (after the mounting of the IC system on the PCB, before the actual use of the memory device) allows correcting most of the errors that may have been caused by the corresponding reflow. Particularly, the writing of the corrected primary code word corrects the memory cell that caused the single error in the primary code word that has been detected and corrected; the writing of the (possibly corrected) secondary code word corrects the memory cells that caused the double error that has been detected but not corrected in the primary code word (since these errors do not appear in the secondary code word or only one of them appeared but was corrected). At the same time, the writing of the whole primary/secondary code word restores the other memory cells (whose phase may have drifted, even if to a lower extent that does not cause any error in the primary code word).

This significantly increases the reliability of the memory device even if during its normal operation the pages are read with the primary reference current only as usual; indeed, a substantial part of the drift of the memory cells (i.e., the drift that caused a double error detected in the reading with the primary reference current but at most one error detected and possibly corrected in the reading with the secondary reference current) is now recovered, so that it disappears during the normal operation of the memory device.

Figure 5:
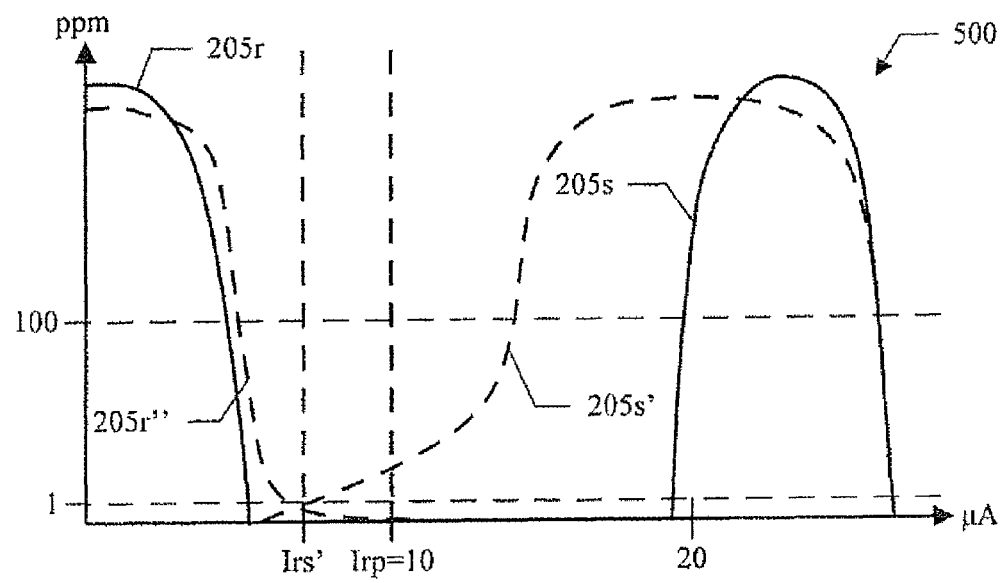
FIG. 5 is a graph showing an illustrative representation of further exemplary statistical distributions of the memory cells of the memory device of FIG. 1.

With reference now to FIG. 5, a further illustrative representation is shown of exemplary statistical distributions of the memory cells of this memory device.

The figure shows a diagram 500 with the above-mentioned distribution curves 205$r$ and 205$s$ (in solid lines). In this case, the situation is considered when the phase of the memory cells drifts with their aging because of retention phenomena; particularly, the conductivity of the reset memory cells may increase (because their phase becomes less amorphous) thereby increasing the reading currents, and the conductivity of the set memory cells may decrease (because their phase becomes less crystalline) thereby decreasing the reading currents. The phenomenon is more evident for the set memory cells than it is for the reset memory cells (i.e., with the decrease of the reading currents of the set memory cells that is higher than the increase of the reading currents of the reset memory cells). As a result, the corresponding (actual) probability distributions may skew thereby providing different probability curves (in dashed lines); particularly, the probability curve of the reset memory cells (differentiated with the reference 205$r''$) exhibits a tail towards higher currents, and the probability curve of the set memory cells (differentiated with the reference 205$s'$) exhibits a tail towards lower currents (with the tail of the probability curve 205$s'$ that is larger than the tail of the probability curve 205$r''$).

In this specific case (wherein the errors are more likely to be due to the drift of the probability distribution of the set memory cells towards lower currents), the secondary reference current (differentiated with the reference Irs') is lower than the primary reference current Irp (for example, 0.5-0.9 times, preferably, 0.6-0.8 times, and still more preferably 0.65-0.75 times, such as 0.7 times, for example, equal to 6.5-8.5 µA).

With reference now to FIGS. 6A-6D, different examples are shown of application of the approach according to an embodiment of the present disclosure.

Particularly, each figure shows a same diagram 600 with a portion of the above-mentioned distribution curves 205$r''$ and 205$s'$ (in solid lines and with their skew that is exaggerated for the sake of clarity). The secondary reference current Irs' (lower than the primary reference current Irp) improves the error correction capability of the memory device with respect to errors caused by the memory cells that are set. For example, the case is considered wherein a first memory cell and a second memory cell are both set (i.e., storing the value 1); the first memory cell provides a reading current denoted with the reference J1 followed by the suffix of the figure (indicated by a star on the distribution curve $205s'$), and the second memory cell provides a reading current denoted with the reference J2 followed by the suffix of the figure (indicated by a circle on the distribution curve $205s'$).

Figure 6A:
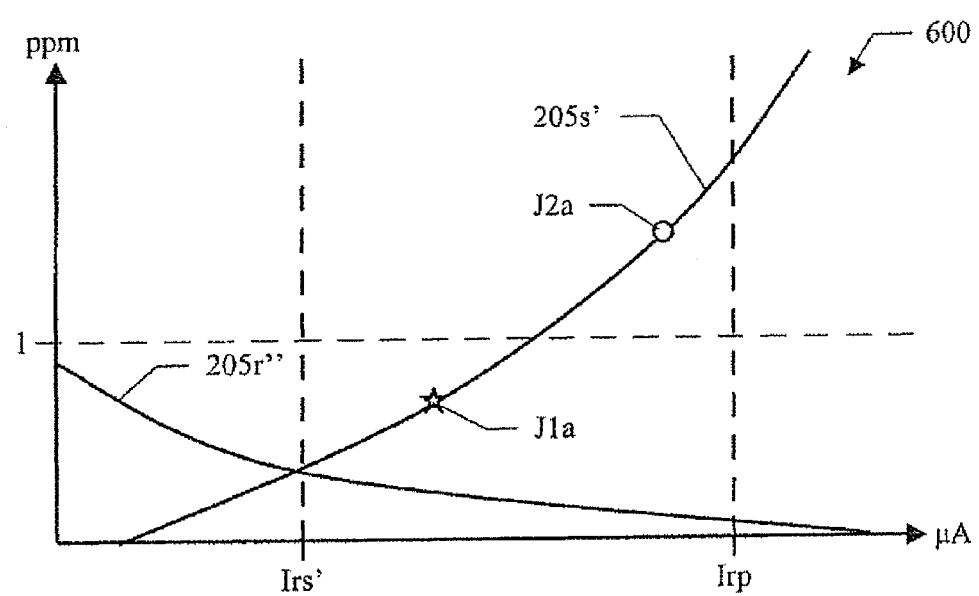
FIGS. 6A-6D are graphs showing different examples of application of the approach according to an embodiment of the present disclosure.

Starting from FIG. 6A, the reading with the primary reference current Ira of these memory cells generates two errors. Indeed, in the first memory cell the wrong value 0 is read, since its reading current $J1a$ is lower than the primary reference current Irp; likewise, in the second memory cell the wrong value 0 is read, since its reading current $J2a$ is lower than the primary reference current Irp. Therefore, should the memory cells be comprised in the same primary code word, it would not be possible to correct it.

However, the reading with the secondary reference current Irs' of the same memory cells does not generate any error. Indeed, in the first memory cell the right value 1 is read, since the reading current $J1a$ is higher than the secondary reference current Irs'; likewise, in the second memory cell the right value 1 is read, since the reading current $J2a$ is higher than the secondary reference current Irs'. Therefore, assuming that the corresponding secondary code word has not other errors, the correct code word may now be obtained from it.

Figure 6B:
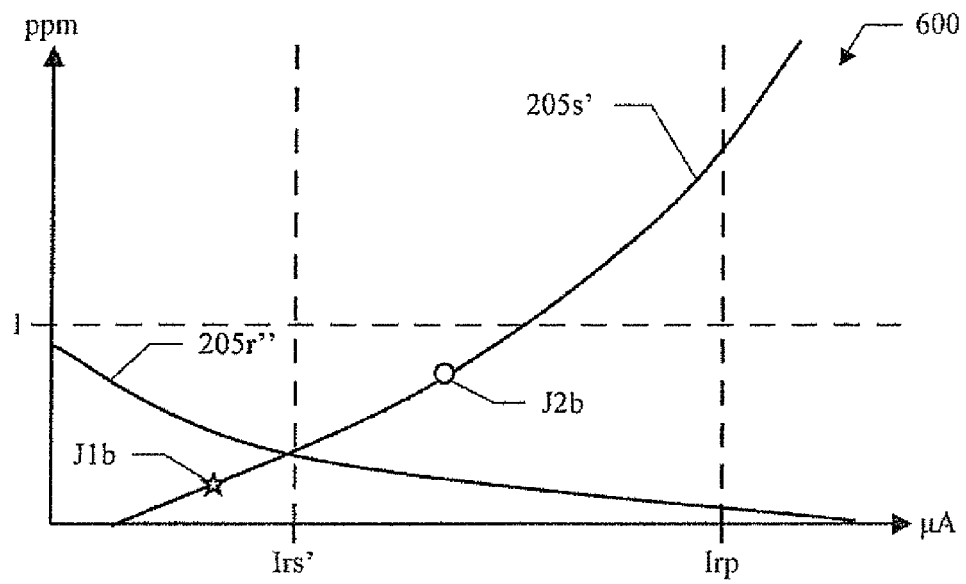

Moving to FIG. 6B, the reading with the primary reference current Irp of the memory cells generates two errors as above. However, the reading with the secondary reference current Irs' of the same memory cells generates a single error. Indeed, in the first memory cell the wrong value 0 is read, since the reading current $J1b$ is lower than the secondary reference current Irs'; conversely, in the second memory cell the right value 1 is read, since the reading current $J2b$ is higher than the secondary reference current Irs'. Therefore, assuming that the corresponding secondary code word has not other errors, the secondary code word may be corrected and the correct code word may now be obtained from it.

Figure 6C:
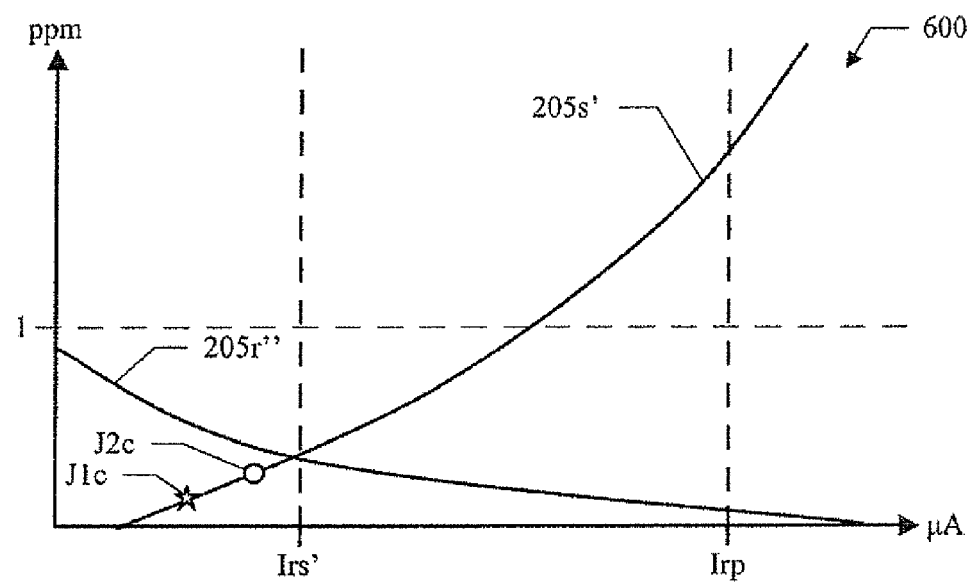

Moving to FIG. 6C, the reading with the primary reference current Irp of the memory cells generates two errors as above. The reading with the secondary reference current Irs' of the same memory cells generates two errors as well. Indeed, in the first memory cell the wrong value 0 is read, since the reading current $I1c$ is lower than the secondary reference current Irs'; likewise, in the second memory cell the wrong value 0 is read, since the reading current $J2c$ is lower than the secondary reference current Irs'. Therefore, should the memory cells be comprised in the same secondary code word, it would not be possible to correct it either.

The secondary reference current Irs' (lower than the primary reference current Irp to improve the error correction capability of the memory device with respect to errors caused by the memory cells that are set) may decrease the error correction capability of the memory device with respect to errors caused by the memory cells that are reset.

Figure 6D:
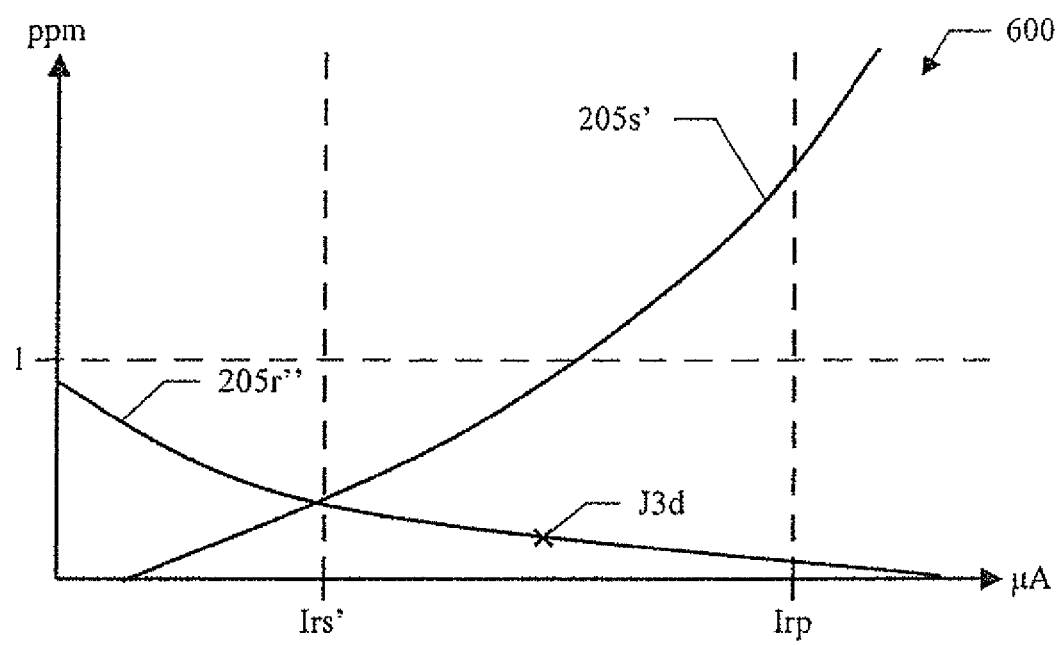

For example, the case is now considered in FIG. 6D wherein a third memory cell is reset (i.e., storing the value 0). The third memory cell provides a reading current denoted with the reference $J3d$ (indicated by a cross on the distribution curve $205r''$).

The reading with the primary reference current Irp of the third memory cell does not generate any error; indeed, in the third memory cell the right value 0 is read, since the reading current $J3d$ is lower than the primary reference current Irp. Therefore, this memory cell does not affect the error correction capability of the reading with the primary reference current Irp.

On the contrary, the reading with the secondary reference current Irs' of the third memory cell now generates an error; indeed, in the third memory cell the wrong value 1 is read, since the reading current $J3d$ is higher than the secondary reference current Irs'. Therefore, this memory cell may impair the error correction capability of the reading with the secondary reference current Irs', i.e., when the corresponding secondary code word has another error (such as in the case of the FIG. 6B).

Similar considerations apply to other possible combinations of values of the reading currents (for the memory cells that are set and/or reset).

As above, it is possible to correct most of the double errors that may occur (since the ones that may not be corrected have a very low probability, for example, lower than 10 ppm); particularly, the decrease of the error correction capability of the memory device with respect to errors caused by the memory cells that are reset is negligible, and in any case largely compensated for by the increase of the error correction capability of the memory device with respect to errors caused by the memory cells that are set. Therefore, this still provides a quasi-2 error correction capability (with a simple Hamming code of 32+7 bits).

Figure 7:
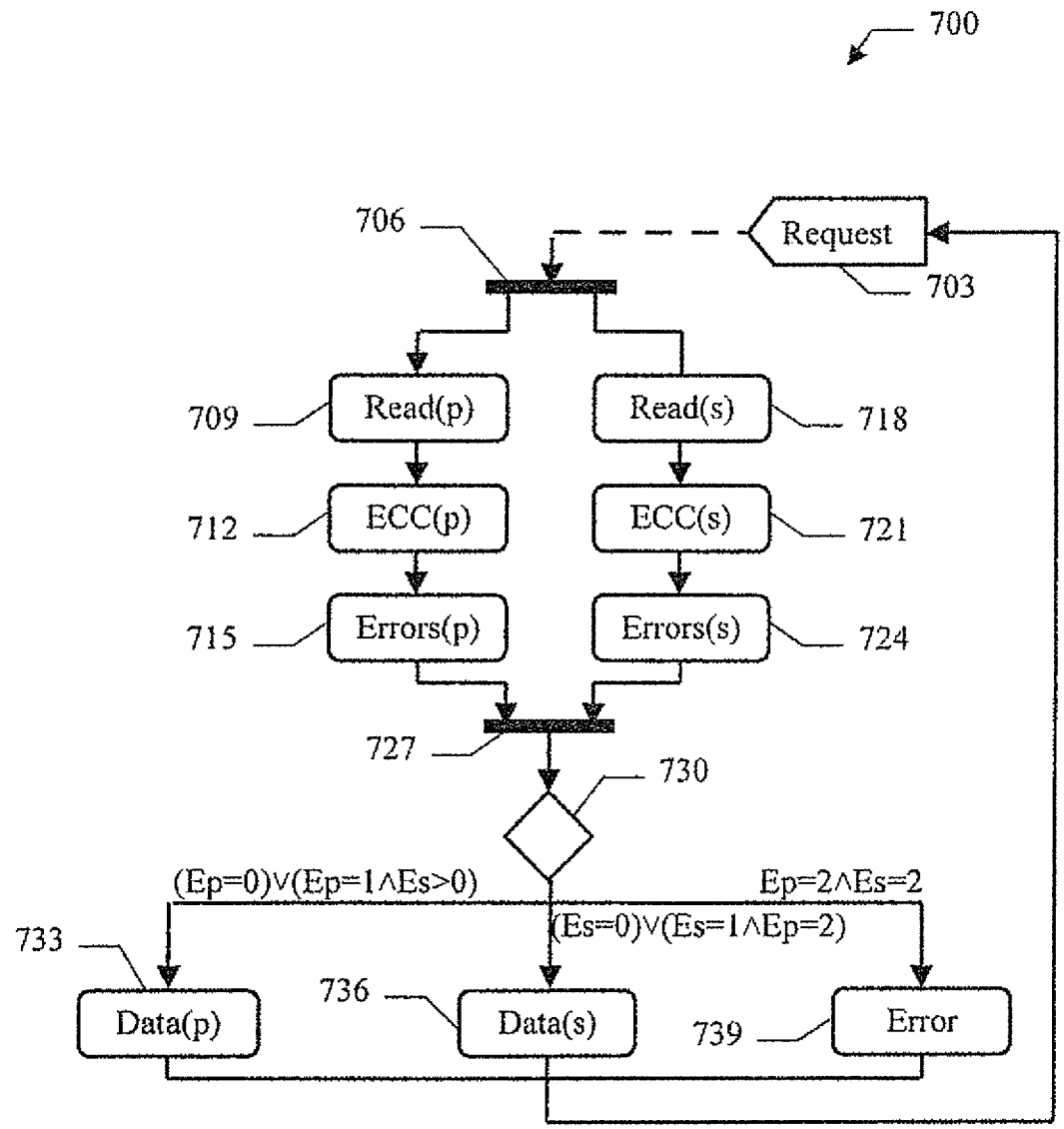
FIG. 7 is an activity diagram illustrating the flow of activities relating to an implementation of the approach according to an embodiment of the present disclosure.

With reference now to FIG. 7, an activity diagram is shown describing the flow of activities relating to an implementation of the approach according to an embodiment of the present disclosure. Particularly, the diagram represents an exemplary process that may be used to read any data word with a method 700. For example, as above the process may be implemented by a firmware of the control unit of the memory device (with each block that may represent one or more executable instructions for implementing the specified logical function by the control unit).

The process is in a waiting condition at block 703. As soon as a request for reading a selected data word is submitted, the flow of activity forks at the synchronization bar 706 into two branches that are executed concurrently.

Particularly, the corresponding selected page is read with the primary reference current at block 709 so as to provide the corresponding primary code word. The primary code word is then processed at block 712 according to the error correction code. A result of this processing is verified at block 715 (i.e., whether the primary code word is correct, it had a single error that has been detected and corrected, or it has a double error that has only been detected). At the same time, the selected page is read with the secondary reference current at block 718 so as to provide the corresponding secondary code word. The secondary code word is then processed at block 721 according to the error correction code. A result of this processing is verified at block 724 (i.e., whether the secondary code word is correct, it had a single error that has been detected and corrected, or it has a double error that has only been detected).

The flow of activity joints at the further synchronization bar 727, which is reached from the block 715 and from the block 724. The flow of activity now branches at block 730 according to the number of errors that have been detected (and possibly corrected) in the primary code word and in the secondary code word. Particularly, if no error has been detected in the primary code word (irrespective of the errors that have been detected in the secondary code word) or if a single error has been detected in the primary code word but one or two errors have been detected in the secondary code word (i.e., (no primary error)—(single primary error, single or double secondary errors)), at block 733 the primary data word is extracted from the primary code word and it is returned as the requested data word.

Instead, if no error has been detected in the secondary code word (irrespectively of the errors that have been detected in the primary code word) or if a single error has been detected in the secondary code word but two errors have been detected in the primary code word (i.e., (no secondary error)—(single secondary error, double secondary errors)), at block 736 the secondary data word is extracted from the secondary code word and it is returned as the requested data word. At the end, if two errors have been detected but not corrected both in the primary code word and in the secondary code word (i.e., (double primary errors) . . . (double secondary errors)), no valid data word is provided and an error condition is entered at block 739. In any case, the process then returns to the block 703 from the block 733, the block 736 or the block 739 waiting for a next reading request.

Figure 8:
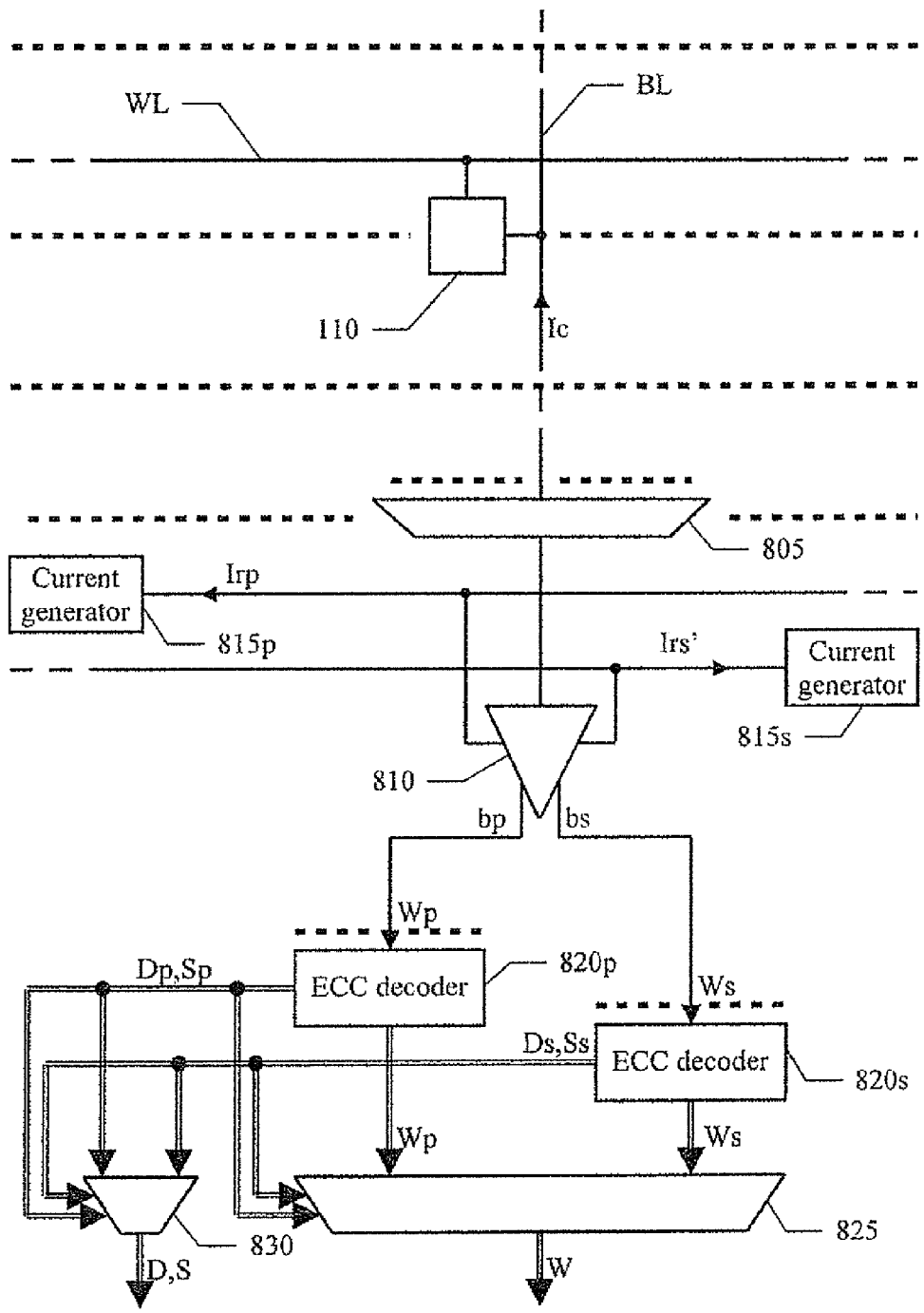
FIG. 8 is a schematic block diagram illustrating a particular memory device according to an embodiment of the present disclosure.

With reference now to FIG. 8, a schematic block diagram is shown of a particular of a memory device according to an embodiment of the present disclosure. As usual, each memory cell 110 (only one shown in the figure) is coupled (via an access transistor thereof) to a common word line WL of the corresponding row (which is driven by the row decoder, not shown in the figure). Moreover, the memory cell 110 is coupled (via its storage element) to a common bit line BL of the corresponding column.

For each i-th position within all the pages (only one shown in the figure), the column decoder comprises a (column) multiplexer 805 and the read/write unit comprises a sense amplifier (SA) 810. The multiplexer 805 selectively couples one among all the corresponding bit lines BL with the sense amplifier 810. In the approach according to an embodiment of the present disclosure, the sense amplifier 810 has a double structure, with an input terminal, a primary reference terminal and a secondary reference terminal for receiving corresponding currents, and a primary output terminal and a secondary output terminal for providing a bit that has the value 1 when the current at the input terminal is higher than the current at the primary reference terminal and at the secondary reference terminal, respectively, and the value 0 otherwise. For example, the sense amplifier 810 may be implemented with two current-to-voltage converters (in current-mirror configuration) that share a common branch for the current received at the input terminal. In this case, the sense amplifier 810 has the input terminal that is coupled with the bit line BL selected by the multiplexer 805. The read/write unit further comprises a (primary) reference current generator 815*p* that provides the primary reference current Irp and a (secondary) reference current generator 815*s* that provides the secondary reference current Irs'. The reference current generators 815*p* and 815*s* are coupled with the primary reference terminal and the secondary reference terminal, respectively, of the sense amplifier 810.

The ECC unit comprises a (primary) ECC decoder 820*p* and a (secondary) ECC decoder 820*s* (for example, each one implemented with an EXOR tree). Each ECC decoder 820*p*, 820*s* has input terminals for receiving a code word, and data output terminals for providing the corresponding data word (by correcting it when necessary and possible) and result output terminals for providing a result signal indicative of a result of the decoding of the code word (for example, composed by a single result signal that is asserted when a single error has been detected and corrected, and by a double result signal that is asserted when a double error has been detected but not corrected).

In this case, the ECC decoder 820*p* has the input terminals coupled with the primary output terminals of all the sense amplifiers 810, and the ECC decoder 820*s* has the input terminals coupled with the secondary output terminals of all the sense amplifiers 810. Moreover, the ECC unit comprises a (data) multiplexer 825, which has first input terminals coupled with the data output terminals of the ECC decoder 820*p*, second input terminals coupled with the data output terminals of the ECC decoder 820*s*, control terminals coupled with the result output terminals of the ECC decoders 820*p*, 820*s*, and output terminals that are selectively coupled with one of its input terminals according to a signal provided to its control terminals. The ECC unit further comprises a (result) multiplexer 830, which has first input terminals coupled with the result output terminals of the ECC decoder 820*p*, second input terminals coupled with the result output terminals of the ECC decoder 820*s*, control terminals coupled with the result output terminals of the ECC decoders 820*p*, 820*s*, and output terminals that are selectively coupled with one of its input terminals according to a signal provided to its control terminals.

During every reading operation of a selected data word, as usual the access transistors of the memory cells 110 of the corresponding selected page are turned on and their storage elements are biased with the reading voltage so as to conduct a current corresponding to their actual phase (i.e., normally low when reset and high when set); the access transistors of all the other memory cells are instead turned off. As a result, the bit lines BL of the memory cells 110 of the selected page conduct the reading currents (denoted with Ic) provided by them.

In the approach according to an embodiment of the present disclosure, each sense amplifier 810 receives the corresponding reading current Ic (through the multiplexer 805), and it outputs the corresponding i-th bit of the primary code word (denoted with bp), which has the value 0 when the reading current Ic is lower than the primary reference current Irp or the value 1 otherwise, and the corresponding i-th bit of the secondary code word (denoted with bs), which has the value 0 when the reading current Ic is lower than the secondary reference current Irs' or the value 1 otherwise. The bits by provided by all the sense amplifiers 810 define the primary code word (denoted with Wp), which is provided to the ECC decoder 820*p*, and the bits bs provided by all the sense amplifiers 810 define the secondary code word (denoted with Ws), which is provided to the ECC decoder 820*s;* the ECC decoder 810*p* accordingly generates the primary data word and the corresponding (primary) single and double result signals (denoted with Wp, Sp and Dp, respectively), and the ECC decoder 810*s* accordingly generates the secondary data word and the corresponding (secondary) single and double result signals (denoted with Ws, Ss and Ds, respectively).

The multiplexer 825 outputs one among the primary data word Wp and the secondary data word Ws (according to the result signals Sp, Dp, Ss, Ds) for the desired data word defining the result of the reading operation (denoted with W); likewise, the multiplexer 830 outputs the corresponding primary result signals Sp, Dp or secondary result signals Ss, Ds (according to the result signals Sp, Dp, Ss, Ds again) defining the result signals of the data word W (denoted with S, D). For example, the logics of the multiplexers 825, 830 may be defined by the following table:

|        | Sp, Dp |  |  |
| --- | --- | --- | --- |
| Ss, Ds | 00 | 10 | 01 |
| 00 | Wp, Dp, Sp<br>Primary:<br>no error<br>Secondary:<br>no error | Ws, Ds, Ss<br>Primary:<br>single error<br>Secondary:<br>no error | Ws, Ds, Ss<br>Primary:<br>double error<br>Secondary:<br>no error |
| 10 | Wp, Dp, Sp<br>Primary:<br>no error<br>Secondary:<br>single error | Wp, Dp, Sp<br>Primary:<br>single error<br>Secondary:<br>single error | Ws, Ds, Ss<br>Primary:<br>double error<br>Secondary:<br>single error |
| 01 | Wp, Dp, Sp<br>Primary:<br>no error<br>Secondary:<br>double error | Wp, Dp, Sp<br>Primary:<br>single error<br>Secondary:<br>double error | Wp, Dp, Sp<br>Primary:<br>double error<br>Secondary:<br>double error |

In the above-described implementation, all the operations relating to the readings with the primary reference current Irp and with the secondary reference current Irs' and the corresponding processing according to the error correction code are performed concurrently; as a result, the access time of the memory device (and then its entire operation) is not adversely affected. Particularly, all the operations may be performed in a single clock period of the memory device, so as to be completely opaque to its control unit.

Naturally, to satisfy local and specific requirements, a person skilled in the art may apply many logical and/or physical modifications and alterations to the present disclosure. More specifically, although this disclosure has been described with a certain degree of particularity with reference to one or more embodiments thereof, it should be understood that various omissions, substitutions and changes in the form and details as well as other embodiments are possible. Particularly, different embodiments of the present disclosure may even be practiced without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment. In any case, ordinal or other qualifiers are merely used as labels to distinguish elements with the same name but do not by themselves connote any priority, precedence or order. Moreover, the terms include, comprise, have, contain and involve (and any forms thereof) should be intended with an open, non-exhaustive meaning (i.e., not limited to the recited items), the terms based on, dependent on, according to, function of (and any forms thereof) should be intended as a non-exclusive relationship (i.e., with possible further variables involved), the term a/an should be intended as one or more items (unless expressly indicated otherwise.

For example, an embodiment provides a method for reading a memory device, which comprises a plurality of memory cells. The method comprises the following steps. A request is received of reading a selected data word associated with a selected code word, which comprises a plurality of logic values stored in one or more selected memory cells with an error correction code. A first code word (representing a first version of the selected code word) is read by comparing a state of each selected memory cell with a first reference. The first code word is verified according to the error correction code. The selected code word is set according to the first code word in response to a positive verification of the first code word. At least one second code word (representing a second version of the selected code word) is read by comparing the state of each selected memory cell with a second reference. The second code word is verified according to the error correction code. The selected code word is set according to the second code word in response to a negative verification of the first code word and to a positive verification of the second code word.

However, the method may be applied to any memory device (see below). The code/data words may comprise any type and number of logic values (even not in binary logic), which are stored in any number of memory cells (either the same or different from the number of logic values of the code word). Any error correction code may be used; for example, it is possible to use data/code words of any lengths, any number of one or more control bits, and any coding scheme (for example, BCH). The code words may be read in any way (see below). Moreover, the same operations may be repeated for any number of second references. The code words may be verified in any way (for example, according to polynomial algorithms). The selected code word may be set in any way according to the first/second code word (see below).

In an embodiment, the verifying of the first code word and the verifying of the second code word comprise verifying a correctness of or a possibility of correcting the corresponding code word according to the error correction code. The setting the selected code word according to the first code word and said setting the selected code word according to the second code word comprise setting the selected code word according to the corresponding code word in response to a positive verification of the correctness of the corresponding code word, or correcting the corresponding code word according to the error correction code and setting the selected code word according to the corrected corresponding code word in response to a negative verification of the correctness of the corresponding code word and to a positive verification of the possibility of correcting the corresponding code word.

However, any number of errors may be detected and corrected. Moreover, the code words may be corrected in any way. For example, it is possible to compare the (corrected) second code word with the first code word and accept it only when the number of different logic values is at most equal to the errors that may be corrected. In any case, the possibility of only correcting or even only detecting the errors is not excluded (for example, with any code word that it used directly only when it is correct).

In an embodiment, the request of reading the selected data word is received with a recovery read command. The method further comprises the following steps. The selected memory cells are corrected according to at least one of the code words. A further request is received of reading the selected data word with a standard read command. A further first code word (representing a further first version of the selected code word) is read by comparing the state of each selected memory cell with the first reference. The further first code word is verified according to the error correction code. The selected data word is set according to the further first code word in response to a positive verification of the further first code word; otherwise, an error condition is entered.

However, the recovery reading command may operate in a different way (for example, at the level of a single page or a block of pages, with the loop over the whole memory device that is implemented outside it). The selected memory cells may be corrected in any way (see below). The selected data word may be set in any way according to the further first code word (for example, by simply extracting its logic values from corresponding positions of the further first code word, possibly corrected, or by calculating it from the further first code word with a specific algorithm).

In an embodiment, the correcting the selected memory cells comprises writing the corrected first code word into the selected memory cells in response to a negative verification of the correctness of the first code word and to a positive verification of the possibility of correcting the first code word. The reading at least one second code word is enabled in response to a negative verification of the possibility of correcting the first code word. The method involves writing, into the selected memory cells, the second code word in response to a positive verification of the correctness of the second code word or the corrected second code word in response to a positive verification of the possibility of correcting the second code word.

However, the selected memory cells may be corrected in any way. For example, it is possible to determine the wrong logic values (either directly from the error correction code or by comparing the corrected code word with its original version or the first and second code words between them) and then write the corresponding memory cells only. In this case, the process may be reiterated (at least once for the first code word) to correct any residual error. For example, a double error may have been detected but not corrected by the reading with the first reference, and a single error may have been corrected by reading with the second reference; in this case, the remaining error may now be corrected by reading again with the first reference. Moreover, the possibility of always reading the second code word(s), either concurrently or in succession with the first code word, is not excluded.

In an embodiment, the method further comprises setting the selected data word according to the first code word in response to a positive verification of the first code word, and setting the selected data word according to the second code word in response to a negative verification of the first code word and to a positive verification of the second code word. The reading a first code word and the reading at least one second code word comprise reading the first code word and the second code word concurrently. The verifying the first code word and the verifying the second code word comprise verifying the first code word and the second code word concurrently.

However, the selected data word may be set according to the first/second code word in any way (see above). Moreover, in this case it is also possible to try inferring the selected data word by comparing the available code words (for example, with a majority scheme) when all their verifications are negative. In any case, the possibility of reading and/or verifying the second code word(s) in succession to the reading/verification of the first code word, or of performing these operations selectively only when they are required, is not excluded.

Generally, similar considerations apply if the same approach is implemented with a corresponding method (by using similar steps with the same functions of more steps or portions thereof, removing some steps being non-essential, or adding further optional steps); moreover, the steps may be performed in a different order, concurrently or in an interleaved way (at least in part).

A further embodiment provides a software program adapted to implement this method.

However, similar considerations apply if the software program takes any other form suitable to be used by any computing machine or in connection therewith, thereby configuring the computing machine to perform the desired operations; particularly, the program may be in the form of resident software, firmware, or microcode, which may be provided on any medium suitable to contain, store, communicate, propagate, or transfer it (and particularly as an article of manufacture on a non-transitory medium). In any case, the same approach lends itself to be implemented with a hardware structure (for example, integrated in a chip of semiconductor material), or with a combination of software and hardware suitably programmed or otherwise configured.

A further embodiment provides a memory device, which comprises a plurality of memory cells. The memory device comprises circuitry or means for receiving a request of reading a selected data word associated with a selected code word, which comprises a plurality of logic values stored in one or more selected memory cells with an error correction code. The memory device comprises circuitry or means for reading a first code word (representing a first version of the selected code word) by comparing a state of each selected memory cell with a first reference. The memory device comprises circuitry or means for verifying the first code word according to the error correction code. The memory device comprises circuitry or means for setting the selected code word according to the first code word in response to a positive verification of the first code word. The memory device comprises circuitry or means for reading at least one second code word (representing a second version of the selected code word) by comparing the state of each selected memory cell with a second reference. The memory device comprises circuitry or means for verifying the second code word according to the error correction code. The memory device comprises circuitry or means for setting the selected code word according to the second code word in response to a negative verification of the first code word and to a positive verification of the second code word.

However, the memory device may be of any non-volatile or even volatile type (for example, flash, EPROM, FTP, SRAM, DRAM), and with any number and type of memory cells (for example, of multilevel type). The means for receiving the reading request may be implemented in any way (for example, with one or more input terminals for receiving the relevant information either is series or in parallel, with or without any corresponding buffer). The means for reading the first code word and each second code word may be implemented in any way; for example, it is possible to compare any quantities (such as currents, voltages) representing a state of the memory cells, either in series or in parallel (see below). The means for verifying the first code word and each second code word may be implemented in any way (for example, with a combinatorial network or a firmware of the control unit), either in series or in parallel (see below). The means for setting the selected code word may be implemented in any way (for example, with a combinatorial network or a firmware of the control unit).

In an embodiment, the means for verifying the first code word and the means for verifying the second code word comprise a unit or means for verifying a correctness of or a possibility of correcting the corresponding code word according to the error correction code. The means for setting the selected code word according to the first code word and the means for setting the selected code word according to the second code word comprise a unit or means for setting the selected code word according to the corresponding code word in response to a positive verification of the correctness of the corresponding code word, and a unit or means for correcting the corresponding code word according to the error correction code and a unit or means for setting the selected code word according to the corrected corresponding code word in response to a negative verification of the correctness of the corresponding code word and to a positive verification of the possibility of correcting the corresponding code word.

However, the means or units for reading and the means for setting may be implemented in any way (see above), either in series or in parallel for the first/second references.

In an embodiment, the means or unit for receiving a request of reading a selected data word comprises a unit or means for receiving a recovery read command. The memory device further comprises a unit or means for correcting the selected memory cells according to at least one of the code words. The memory device comprises a unit or means for receiving a further request of reading the selected data word with a standard read command. The memory device comprises a unit or means for reading a further first code word representing a further first version of the selected code word by comparing the state of each selected memory cell with the first reference. The memory device comprises a unit or means for verifying the further first code word according to the error correction code. The memory device comprises a unit or means for setting the selected data word according to the further first code word in response to a positive verification of the further first code word or entering an error condition otherwise.

However, the recovery reading command and the standard reading command may be provided in any way (for example, with different command codes or by interpreting a same command code differently in different states of the memory device that may be selected in any way). Moreover, the means for correcting and the means for processing the standard reading command may be implemented in any way (see above), either in series or in parallel.

In an embodiment, the means for correcting the selected memory cells comprises a unit or means for writing the corrected first code word into the selected memory cells in response to a negative verification of the correctness of the first code word and to a positive verification of the possibility of correcting the first code word. The means for correcting comprises a unit or means for enabling the reading of the second code word in response to a negative verification of the possibility of correcting the first code word. The means for correcting comprises a unit or means for writing, into the selected memory cells, the second code word in response to a positive verification of the correctness of the second code word or the corrected second code word in response to a positive verification of the possibility of correcting the second code word.

However, the means for correcting may be implemented in any way (see above), either in series or in parallel for each code word.

In an embodiment, the memory device further comprises a unit or means for setting the selected data word according to the first code word in response to a positive verification of the first code word. The memory device comprises a unit or means for setting the selected data word according to the second code word in response to a negative verification of the first code word and to a positive verification of the second code word. The means for reading a first code word and the means for reading at least one second code word comprises a unit or means for reading the first code word and the second code word concurrently. The means for verifying the first code word and the means for verifying the second code word comprises a unit or means for verifying the first code word and the second code word concurrently.

However, the means for setting the selected data word may be implemented in any way (see above). Moreover, the means for reading and the means for verifying may be implemented in any way. For example, each double sense amplifier may be implemented either with a dedicated circuitry or with two distinct sense amplifiers; in any case, it is possible to provide any number of sense amplifiers and/or ECC decoders for each bit (down to only one single sense amplifier and/or only one ECC decoder).

A further embodiment provides a system comprising one or more of these memory devices.

However, the system may be of any type (for example, a smart-card, a smart-phone, an automotive system).

Generally, similar considerations apply if the memory device and the system each has a different structure or comprises equivalent components, or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

That which is claimed:

1. A method for reading a memory device comprising a plurality of memory cells, the method comprising:
   receiving a request of reading a selected data word associated with a selected code word comprising a plurality of logic values stored in at least one selected memory cell of the plurality of memory cells with an error correction code;
   reading a first code word representing a first version of the selected code word by comparing a state of the at least one selected memory cell with a first reference;
   verifying the first code word according to the error correction code;
   setting the selected code word according to the first code word in response to a positive verification of the first code word;
   reading at least one second code word representing a second version of the selected code word by comparing the state of the at least one selected memory cell with a second reference;
   verifying the second code word according to the error correction code; and
   setting the selected code word according to the second code word in response to a negative verification of the first code word and to a positive verification of the second code word.

2. The method according to claim 1, wherein verifying the first code word and verifying the second code word comprise verifying at least one of a correctness of the corresponding code word and an option of correcting the corresponding code word according to the error correction code; and wherein setting the selected code word according to the first code word and setting the selected code word according to the second code word comprises at least one of:
   setting the selected code word according to the corresponding code word in response to a positive verification of the correctness of the corresponding code word; and
   correcting the corresponding code word according to the error correction code and setting the selected code word according to the corrected corresponding code word in response to a negative verification of the correctness of the corresponding code word and to a positive verification of the possibility of correcting the corresponding code word.

3. The method according to claim 2, wherein the request of reading the selected data word is received with a recovery read command, the method further comprising:
correcting the at least one selected memory cell according to at least one of the code words;
receiving a further request of reading the selected data word with a regular read command;
reading a further first code word representing a further first version of the selected code word by comparing the state of the at least one selected memory cell with the first reference;
verifying the further first code word according to the error correction code; and
setting the selected data word according to the further first code word in response to a positive verification of the further first code word or entering an error condition otherwise.

4. The method according to claim 3, wherein correcting the at least one selected memory cell comprises:
writing the corrected first code word into the at least one selected memory cell in response to a negative verification of the correctness of the first code word and to a positive verification of the option of correcting the first code word;
enabling reading of at least one second code word in response to a negative verification of the option of correcting the first code word; and
writing, into the at least one selected memory cell, the second code word in response to a positive verification of the correctness of the second code word or the corrected second code word in response to a positive verification of the option of correcting the second code word.

5. The method according to claim 1, further comprising:
setting the selected data word according to the first code word in response to a positive verification of the first code word; and
setting the selected data word according to the second code word in response to a negative verification of the first code word and to a positive verification of the second code word;
reading of the first code word and reading of at least one second code word comprising reading the first code word and the second code word concurrently; and
verifying the first code word and verifying the second code word comprising verifying the first code word and the second code word concurrently.

6. A method for reading a memory device comprising a plurality of memory cells, the method comprising:
receiving a request of reading a selected data word associated with a selected code word stored in selected memory cells of the plurality thereof with an error correction code;
reading a first code word representing a first version of the selected code word;
verifying the first code word according to the error correction code;
setting the selected code word according to the first code word based upon a positive verification of the first code word;
reading at least one second code word representing a second version of the selected code word;
verifying the at least one second code word according to the error correction code; and
setting the selected code word according to the at least one second code word in response to a negative verification of the first code word and to a positive verification of the at least one second code word.

7. The method according to claim 6, wherein verifying the first code word and verifying the second code word comprise verifying at least one of a correctness of the corresponding code word and an option of correcting the corresponding code word according to the error correction code; and wherein setting the selected code word according to the first code word and setting the selected code word according to the second code word comprises at least one of:
setting the selected code word according to the corresponding code word in response to a positive verification of the correctness of the corresponding code word; and
correcting the corresponding code word according to the error correction code and setting the selected code word according to the corrected corresponding code word in response to a negative verification of the correctness of the corresponding code word and to a positive verification of the possibility of correcting the corresponding code word.

8. The method according to claim 7, wherein the request of reading the selected data word is received with a recovery read command, the method further comprising:
correcting the selected memory cells according to at least one of the code words;
receiving a further request of reading the selected data word with a regular read command;
reading a further first code word representing a further first version of the selected code word;
verifying the further first code word according to the error correction code; and
setting the selected data word according to the further first code word in response to a positive verification of the further first code word, and entering an error condition otherwise.

9. The method according to claim 8, wherein correcting the selected memory cells comprises:
writing the corrected first code word into the selected memory cells in response to a negative verification of the correctness of the first code word and to a positive verification of the option of correcting the first code word;
enabling said reading of at least one second code word in response to a negative verification of the option of correcting the first code word; and
writing, into the selected memory cells, the second code word in response to a positive verification of the correctness of the second code word or the corrected second code word in response to a positive verification of the option of correcting the second code word.

10. The method according to claim 6, further comprising:
setting the selected data word according to the first code word in response to a positive verification of the first code word; and
setting the selected data word according to the second code word in response to a negative verification of the first code word and to a positive verification of the second code word;
reading of the first code word and reading of at least one second code word comprising reading the first code word and the second code word concurrently; and verifying the first code word and verifying the second code word comprising verifying the first code word and the second code word concurrently.

11. A memory device comprising:
a plurality of memory cells;
circuitry configured to receive a request of reading a selected data word associated with a selected code word comprising a plurality of logic values stored in selected memory cells of the plurality of memory cells with an error correction code;
circuitry configured to read a first code word representing a first version of the selected code word by comparing a state of each selected memory cell with a first reference;
circuitry configured to verify the first code word according to the error correction code;
circuitry configured to set the selected code word according to the first code word in response to a positive verification of the first code word;
circuitry configured to read at least one second code word representing a second version of the selected code word by comparing the state of each selected memory cell with a second reference;
circuitry configured to verify the second code word according to the error correction code; and at least one
circuitry configured to set the selected code word according to the at least one second code word in response to a negative verification of the first code word and to a positive verification of the at least one second code word.

12. The memory device according to claim 11, wherein the circuitry configured to verify the first code word and the circuitry configured to verify the second code word comprise circuitry configured to verify at least one of a correctness of the corresponding code word and an option of correcting the corresponding code word according to the error correction code; and wherein the circuitry configured to set the selected code word according to the first code word and the circuitry configured to set the selected code word according to the second code word comprise:
circuitry configured to set the selected code word according to the corresponding code word in response to a positive verification of the correctness of the corresponding code word; and
circuitry configured to correct the corresponding code word according to the error correction code and configured to set the selected code word according to the corrected corresponding code word in response to a negative verification of the correctness of the corresponding code word and to a positive verification of the option of correcting the corresponding code word.

13. The memory device according to claim 12, wherein the circuitry configured to receive a request of reading a selected data word comprises circuitry configured to receive a recovery read command, the memory device further comprising:
circuitry configured to correct the selected memory cells according to at least one of the code words;
circuitry configured to receive a further request of reading the selected data word with a regular read command;
circuitry configured to read a further first code word representing a further first version of the selected code word by comparing the state of each selected memory cell with the first reference;
circuitry configured to verify the further first code word according to the error correction code; and
circuitry configured to set the selected data word according to the further first code word in response to a positive verification of the further first code word or otherwise entering an error condition.

14. The memory device according to claim 13, wherein the circuitry configured to correct the selected memory cells comprises:
circuitry configured to write the corrected first code word into the selected memory cells in response to a negative verification of the correctness of the first code word and to a positive verification of the option of correcting the first code word;
circuitry configured to enable the reading of the second code word in response to a negative verification of the possibility of correcting the first code word; and
circuitry configured to write, into the selected memory cells, the second code word in response to a positive verification of the correctness of the second code word or the corrected second code word in response to a positive verification of the option of correcting the second code word.

15. The memory device according to claim 11, further comprising circuitry configured to set the selected data word according to the first code word in response to a positive verification of the first code word, and configured to setting the selected data word according to the second code word in response to a negative verification of the first code word and to a positive verification of the second code word; and wherein the circuitry configured to read a first code word and the circuitry configured to read at least one second code word comprises circuitry configured to read the first code word and the second code word concurrently, and the circuitry configured to verify the first code word and the circuitry configured to verify the second code word comprises circuitry configured to verify the first code word and the second code word concurrently.

* * * * *